United States Patent
Iijima et al.

(10) Patent No.: US 7,342,802 B2
(45) Date of Patent: Mar. 11, 2008

(54) MULTILAYER WIRING BOARD FOR AN ELECTRONIC DEVICE

(75) Inventors: Tomoo Iijima, Tokyo (JP); Yoshitaka Fukuoka, Tokyo (JP)

(73) Assignee: Tessera Interconnect Materials, Inc., San Jose, CA (US)

( * ) Notice: Subject to any disclaimer, the term of this patent is extended or adjusted under 35 U.S.C. 154(b) by 0 days.

(21) Appl. No.: 10/880,588

(22) Filed: Jul. 1, 2004

(65) Prior Publication Data

US 2005/0000729 A1   Jan. 6, 2005

(30) Foreign Application Priority Data

| Jul. 2, 2003 | (JP) | ............................. 2003-190162 |
| Jul. 2, 2003 | (JP) | ............................. 2003-190259 |
| Jul. 2, 2003 | (JP) | ............................. 2003-190342 |

(51) Int. Cl.
   *H05K 7/00*   (2006.01)
(52) U.S. Cl. .................. 361/760; 361/763; 361/766; 361/782; 361/793; 361/795; 174/255; 174/257; 174/258; 174/260; 174/261; 174/262; 174/263; 174/264; 174/265; 174/266; 257/687; 257/724
(58) Field of Classification Search ................ 174/255, 174/257–258, 260–266; 361/760, 763, 766, 361/782, 793, 795; 257/687, 724
See application file for complete search history.

(56) References Cited

U.S. PATENT DOCUMENTS

| 6,356,455 B1 * | 3/2002 | Carpenter ................... 361/793 |
| 6,522,555 B2 * | 2/2003 | Hirano et al. ............... 361/760 |
| 6,538,210 B2 * | 3/2003 | Sugaya et al. .............. 174/258 |
| 6,696,764 B2 * | 2/2004 | Honda ......................... 257/778 |
| 6,734,542 B2 * | 5/2004 | Nakatani et al. ............ 257/687 |
| 6,828,510 B1 * | 12/2004 | Asai et al. .................. 174/255 |
| 6,855,892 B2 * | 2/2005 | Komatsu et al. ............ 174/256 |
| 6,975,516 B2 * | 12/2005 | Asahi et al. ................ 361/761 |
| 2002/0000328 A1 * | 1/2002 | Motomura et al. ......... 174/255 |
| 2004/0150966 A1 * | 8/2004 | Hu ............................. 361/763 |

* cited by examiner

*Primary Examiner*—Tuan T. Dinh
*Assistant Examiner*—Hoa C Nguyen
(74) *Attorney, Agent, or Firm*—Lerner, David, Littenberg, Krumholz & Mentlik, LLP (57) ABSTRACT

To provide a multilayer wiring board mainly used for an electronic device, in which a bump passing through an interlayer insulating film allows for interlayer connection between plural wiring films insulated from one another with plural interlayer insulating layers. In the multilayer wiring board, a circuit element such as an electronic part, a semiconductor chip, or a passive element is accommodated in the interlayer insulating films so as to connect its terminal with the corresponding wiring film. In particular, the semiconductor chip is polished to a thickness of 50 μm or smaller, and the multilayer wiring board itself for the electronic device has the flexibility.

26 Claims, 6 Drawing Sheets

11L IS CUT OUT AND OMITTED FROM DIAGRAM

MULTILAYER WIRING BOARD FOR AN ELECTRONIC DEVICE

BACKGROUND OF THE INVENTION

1. Field of the Invention

The present invention relates to a multilayer wiring board and a method of manufacturing the same. The multilayer wiring board is used as an electronic circuit part in an electronic device such as an endoscope or a pacemaker, which includes a circuit element such as an electronic part or a functional passive element and which is inserted or implanted in the human body, or passed through the human body.

2. Description of the Related Art

In particular, as regards a multilayer wiring board for an electronic device as a medical device with a built-in circuit element, there are a demand to downsize the device due to a three-dimensional arrangement of circuit elements as well as a demand to keep a flexibility inherent in the multilayer wiring board in many cases. The "circuit element" used herein is the generic term for elements constituting an electronic circuit, such as an electronic part, a functional passive element, and a functional active element. Further, the "multilayer wiring board" is defined as a component used for the electronic device as a specific medical device. To that end, in light of the past achievement that a semiconductor chip as a circuit element can exhibit a flexibility if its thickness is 50 µm or smaller and a multilayer wiring board exhibiting a flexibility by itself has been already developed, the inventors of the present invention have hit on an idea about how to provide an electronic device having a multilayer wiring board with a built-in flexible semiconductor chip.

SUMMARY OF THE INVENTION

The present invention has therefore an object to provide a multilayer wiring board with a built-in circuit element that allows downsizing of the multilayer wiring board and affords a diversity of circuit functions in an electronic device.

It is another object of the present invention to provide a multilayer wiring board with a built-in flexible semiconductor chip and a method of manufacturing the same.

It is still another object of the present invention to provide a multilayer wiring board that realizes a high packaging density by embedding passive elements into the multilayer wiring board and by three-dimensionally arranging semiconductor integrated circuit elements and the passive elements, and a method of manufacturing the same.

It is yet still another object of the present invention to provide a multilayer wiring board for an electronic device, which is constituted of a rigid wiring portion including a circuit element and a flexible wiring portion including a flexible semiconductor chip to thereby realize a still higher integration scale of the multilayer wiring board.

In order to attain the above-mentioned objects, according to a first aspect of the present invention, there is provided a multilayer wiring board for an electronic device, including: at least two metal plates that are laminated and each formed by laminating wiring films each made from a metal layer through at least one insulating film and connecting between the wiring films with an interlayer connection pump passing through the insulating film; and a circuit element interposed between the metal plates and connected to one of the wiring films.

In order to attain the above-mentioned objects, according to a second aspect of the present invention, in the multilayer wiring board for an electronic device according to the first aspect of the invention, the circuit element includes a semiconductor chip embedded in one of the insulating films and polished to have a thickness of 50 µm or smaller.

In order to attain the above-mentioned objects, according to a third aspect of the present invention, there is provided a multilayer wiring board for an electronic device, including: a first metal plate having a wiring film formed on its one surface, where a terminal bump is formed on a rear surface of at least part of the wiring film; a semiconductor chip that is formed with a thickness of 50 µm or smaller on the one surface of the first metal plate, and is subjected to flip-chip bonding with its electrode connected with the wiring film; a second metal plate having on the same surface an interlayer connection bump connected to the wiring film on the one surface of the first metal plate, and a semiconductor chip accommodating space for accommodating the semiconductor chip, and having a wiring film formed on the other surface, the second metal plate being laminated on the first metal plate such that the semiconductor chip is accommodated within the semiconductor chip accommodating space and the interlayer connection bump is connected to the corresponding wiring film; and an interlayer insulating film being formed between the bumps for insulating between the bumps and between the wiring film on the first metal plate and the wiring film on the second metal plate.

In order to attain the above-mentioned objects, according to a fourth aspect of the present invention, in the multilayer wiring board for an electronic device according to the second aspect of the invention, an electrode of the semiconductor chip is connected with the wiring film through an electrode connection bump made of a conductive material and selectively formed on a surface portion of the wiring film.

In order to attain the above-mentioned objects, according to a fifth aspect of the present invention, in the multilayer wiring board for an electronic device according to the first aspect of the invention, the circuit element includes a passive element.

In order to attain the above-mentioned objects, according to a sixth aspect of the present invention, in the multilayer wiring board for an electronic device according to the fifth aspect of the invention, the passive element is one selected from the group consisting of a resistor, a capacitor, and an inductor.

In order to attain the above-mentioned objects, according to a seventh aspect of the present invention, in the multilayer wiring board for an electronic device according to the fifth aspect of the invention, the passive element is formed in one of the insulating films such that a terminal is connected with the wiring film by using an element film made of an identical/different material to/from a material for the wiring film.

In order to attain the above-mentioned objects, according to an eighth aspect of the present invention, in the multilayer wiring board for an electronic device according to any one of the third to seventh aspects of the invention, the interlayer insulating film includes an insulating film selected from the group consisting of a polyimide film, a liquid crystal polymer film, a glass cloth impregnated with a B-stage resin, and a BCB film.

In order to attain the above-mentioned objects, according to a ninth aspect of the present invention, there is provided a method of manufacturing a multilayer wiring board for an electronic device, including: preparing a first metal plate by forming a wiring film on a surface of a terminal bump formation metal layer; preparing a semiconductor chip that is formed with a thickness of 50 μm or smaller; preparing a second metal plate in which an interlayer connection bump connected to the wiring film on the first metal plate, and a semiconductor chip accommodating space for accommodating the semiconductor chip are formed on one surface of a wiring film formation metal layer, and the interlayer connection bump passes through the surface, and an interlayer insulating film is laminated thereon outside the semiconductor chip accommodating space; subjecting the semiconductor chip to flip-chip bonding to one surface of the first metal plate on a side where the wiring film is formed such that its electrode is connected with the wiring film; laminating the second metal plate through the interlayer insulating film on the one surface of the first metal plate on the side where the wiring film is formed by connecting to the wiring film on the second metal plate a top surface of the interlayer connection bump exposed to the interlayer insulating film while the semiconductor chip is accommodated within the semiconductor chip accommodating space; forming a wiring film by selectively etching the wiring film formation metal layer of the second metal plate; and forming a terminal bump by selectively etching the terminal bump formation metal layer of the first metal plate.

In order to attain the above-mentioned objects, according to a tenth aspect of the present invention, there is provided a method of manufacturing a multilayer wiring board for an electronic device, including: preparing a first metal layer constituting a wiring film where a passive element made from an element film is formed on its one surface; preparing a second metal layer used as a base where bumps are selectively formed on its one surface by effecting one of selective etching and selective plating on a metal plate; laminating the second metal layer on the first metal layer on a side where the element film is formed, through an interlayer insulating film such that the bumps pass through the interlayer insulating film to be connected with the first metal layer; and forming a wiring film connected with a terminal of the passive element by selectively etching the first metal layer.

In order to attain the above-mentioned objects, according to an eleventh aspect of the present invention, there is provided a method of manufacturing a multilayer wiring board for an electronic device, including: preparing a metal layer constituting a wiring film where a passive element made from an element film is formed on its surface; forming bumps each constituting an interlayer connection conductive layer by selectively etching a second metal layer of a laminate metal plate prepared by laminating a first metal layer and the second metal layer through a third metal layer serving as an etching stopper; laminating an interlayer insulating film on a surface having the bumps formed thereon of the laminate metal plate such that the bumps pass through the interlayer insulating film; polishing a surface of each of the bumps; bonding, for lamination, the surface having the element film formed thereon of the metal layer to the surface of the laminate metal plate on which the interlayer insulating film is laminated such that the bumps are connected with the metal layer; forming a wiring film connected with a terminal of the passive element by selectively etching the metal layer having the passive element formed thereon; and forming a wiring film by selectively etching the first metal layer of the laminate metal plate.

In order to attain the above-mentioned objects, according to a twelfth aspect of the present invention, in the method of manufacturing a multilayer wiring board for an electronic device according to the tenth or eleventh aspect of the invention, the passive element includes a resistor made from the element film formed by printing on the surface of the metal layer, carbon phenol or other low-temperature curing organic resins, followed by drying and curing.

In order to attain the above-mentioned objects, according to a thirteenth aspect of the present invention, in the method of manufacturing a multilayer wiring board for an electronic device according to the tenth or eleventh aspect of the invention, the passive element includes a resistor made from the element film formed by selectively applying ruthenium oxide or other high-temperature calcining inorganic thick paste to the surface of the metal layer and drying the resultant, followed by calcination in a reducing atmosphere furnace.

In order to attain the above-mentioned objects, according to a fourteenth aspect of the present invention, in the method of manufacturing a multilayer wiring board for an electronic device according the tenth or eleventh aspect of the invention, the passive element includes a capacitor made from the element film formed by selectively applying to the surface of the metal layer a low-temperature curing organic resin mainly containing barium titanate, followed by drying and curing.

In order to attain the above-mentioned objects, according to a fifteenth aspect of the present invention, in the method of manufacturing a multilayer wiring board for an electronic device according to the tenth or eleventh aspect of the invention, the passive element includes a capacitor made from the element film formed by selectively applying a high-temperature calcining inorganic thick paste mainly containing barium titanate on the surface of the metal layer and drying the resultant, followed by calcination in a reducing atmosphere furnace.

In order to attain the above-mentioned objects, according to a sixteenth aspect of the present invention, there is provided a multilayer wiring board for an electronic device, including: three or more wiring films laminated through insulating films; a bump for interlayer connection, formed on one of the two wiring films insulated from each other, and connected with the other thereof at its top portion; a first wiring portion incorporating the circuit element according to the first aspect of the invention; and a second wiring portion constituted of the multilayer wiring board according to the third aspect of the invention.

In order to attain the above-mentioned objects, according to a seventeenth aspect of the present invention, in the multilayer wiring board for an electronic device according to the sixteenth aspect of the invention, a semiconductor chip of the second wiring portion is prepared through one of a process for polishing a rear surface of a semiconductor wafer to a thickness of 50 μm or smaller with the semiconductor wafer having integrated circuits formed on a front surface, and cutting the semiconductor wafer on the basis of the integrated circuit, and a process for cutting the semiconductor wafer having the integrated circuits formed thereon such that the integrated circuits are separated from one another, followed by polishing a rear surface of each of the integrated circuits to a thickness of 50 μm or smaller, and the semiconductor chip is subjected to flip-chip bonding to a wiring film of the second wiring portion.

In order to attain the above-mentioned objects, according to an eighteenth aspect of the present invention, in the multilayer wiring board for an electronic device according to the sixteenth or seventeenth aspect of the invention, the bump is formed integrally with the wiring film by etching a second metal layer of a laminate metal plate prepared by laminating a first metal layer constituting the wiring film after etching and the second metal layer constituting the bump after etching through a third metal layer constituting an etching barrier.

Hereinafter, a description will be made of a structure of the present invention while focused on first to third embodiments of the present invention with reference to the accompanying drawings. Through the drawings, the same reference symbols denote the same members.

BRIEF DESCRIPTION OF THE DRAWINGS

In the accompanying drawings:

FIGS. 1A to 1C are sectional views of a multilayer wiring board according to a first embodiment of the present invention, in which FIG. 1A shows the multilayer wiring board in a normal state, FIG. 1B exaggeratingly shows the multilayer wiring board in a bent state, and FIG. 1C exaggeratingly shows a built-in semiconductor chip in a bent state;

DETAILED DESCRIPTION OF THE PREFERRED EMBODIMENTS

First Embodiment

Figure 1A:
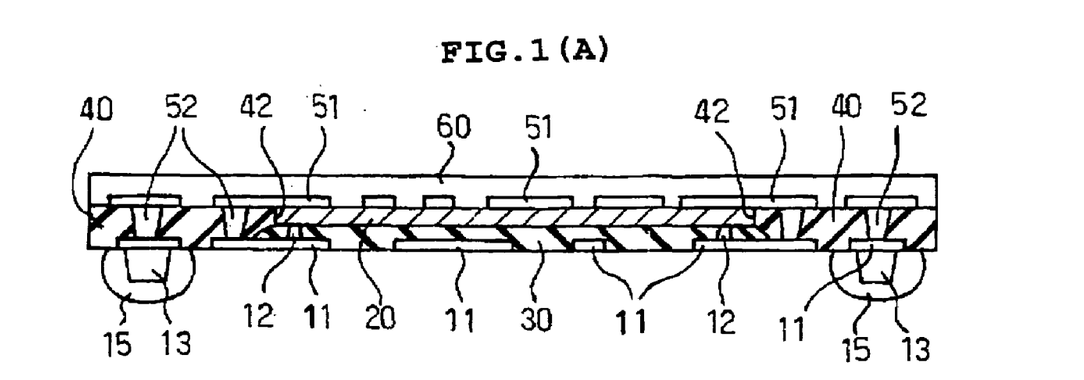
Figure 1B:
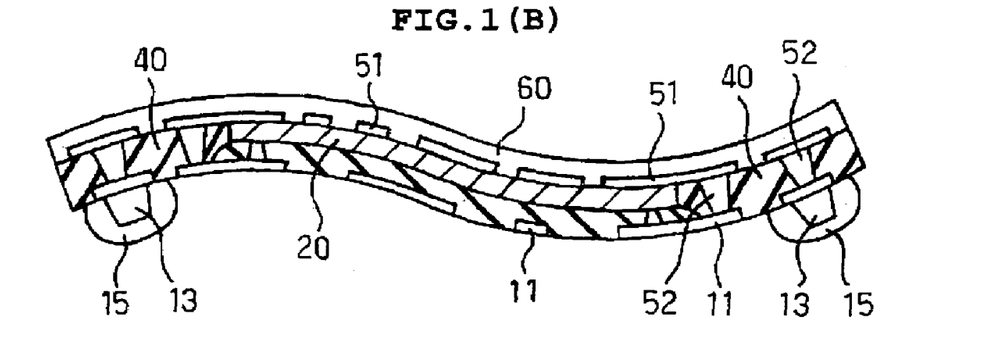
Figure 1C:
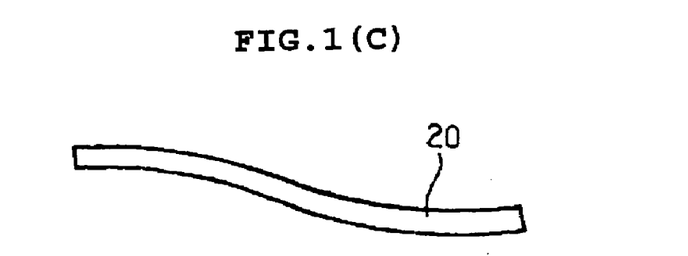

Hereinafter, the present invention will be described in detail according to a first embodiment of the present invention with referent to the corresponding drawings. FIGS. 1A to 1C are sectional views each showing a multilayer wiring board for an electronic device according to the first embodiment of the present invention. The multilayer wiring board for an electronic device exhibits a flexibility.

FIG. 1A shows the multilayer wiring board in a normal state. FIG. 1B exaggeratingly shows the multilayer wiring board in a bent state. FIG. 1C exaggeratingly shows a built-in semiconductor chip in a bent state.

The multilayer wiring board is used for an electronic device as a medical device requiring a flexibility, such as an endoscope or a cardiac pacemaker. Note that the multilayer wiring board itself may be referred to as the electronic device; the wiring board is basically defined as a part generally used in a special-purpose electronic device.

In FIGS. 1A to 1C, reference numeral 11 denotes a wiring film formed into a predetermined pattern by selective plating with nickel (0.5 to 2 µm in thickness, for example) and copper (3 to 18 µm in thickness, for example), for instance. Formed on the wiring film 11 are plural electrode connection bumps 12 prepared by plating with gold, for instance, and connected with an electrode of a semiconductor chip 20 such as a semiconductor integrated circuit chip or a large scale integrated circuit chip. The semiconductor chip 20 as a circuit element has a main surface facing a surface where each bump 12 is formed and has electrodes each connected with the corresponding electrode connection bump 12 through flip chip bonding.

Denoted by 30 is an insulating film covering the main surface of the semiconductor chip 20 and insulating the semiconductor chip 20 from the wiring film 11. The insulating film is made of an insulating material with a flexibility, for example, an underfill resin or film (ACF, ACP, NCF, or NCP).

The semiconductor chip 20 is adjusted to a thickness of 10 to 50 µm so as to exhibit a flexibility by polishing a surface opposite to the main surface on which the integrated circuit is formed, i.e., a rear surface of a semiconductor substrate (semiconductor substrate after cut into a semiconductor chip or still in a wafer state). In addition, the substrate is cut into a chip whose size is about 20 mm on a side, for example. In this way, the semiconductor chip 20 taking a rectangular shape (e.g., about 20 mm on a side) and having a thickness of 50 µm or smaller is bent as shown in FIG. 1C.

A terminal bump 13 made of copper is formed on an opposite side to the semiconductor chip 20 of the wiring film 11 and used for leading out each electrode of the semiconductor chip 20 to the outside. Solder balls 15 are each formed to entirely cover the terminal bump 13 with a thickness of 50 to 200 µm and a diameter of 50 to 250 µm and arranged at a pitch of 300 to 800 µm.

An interlayer insulating film 40 is an insulating film made of, for example, polyimide film, a liquid crystal polymer film, or a glass cloth impregnated with a B-stage resin. This interlayer insulating film functions to insulate the wiring film 11 from a wiring film 51 described later and has a chip accommodating space 42 for accommodating the semiconductor chip 20. An interlayer connection bump 52 described below passes through the interlayer insulating film 40.

The wiring film 51 is made of, for example, copper. Formed on its rear surface are the plural interlayer connection bumps 52 having a diameter of about 50 to 100 µm. The respective interlayer connection bumps 52 electrically connect between the wiring films 11 and 51 at predetermined positions. On the other hand, an insulating film 60 is formed on a front surface of the wiring film 51. The total thickness of the wiring film 11 to the insulating film 60 is about 50 to 100 µm.

The above multilayer wiring board well exhibits a flexibility even when the semiconductor chip 20 is unmounted. The semiconductor chip 20 itself can, as long as its thickness is not more than 50 µm, exhibit a flexibility as shown in FIG. 1C, which means that if mounted with the semiconductor chip 20, the multilayer wiring board has a flexibility as shown in FIG. 1B.

Accordingly, in the case where this multilayer wiring board is used for an electronic device such as an endoscope, a pacemaker, or a sphygmomanometer, which is inserted or implanted in the human body or passed through the human body, the board can match with the human body on account of its flexibility. As a result, it is possible to minimize an influence of such an electronic device on the human body.

FIGS. 2A to 2F are sectional views each showing an example of a method of manufacturing the multilayer wiring board of FIGS. 1A to 1C in the step order.

Figure 2A:
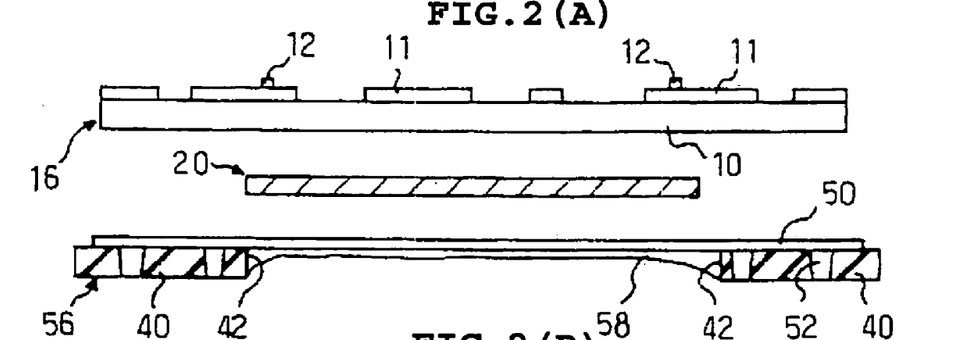
FIGS. 2A to 2F are sectional views each showing an example of a method of manufacturing the multilayer wiring board of FIGS. 1A to 1C in the step order.

(A) As shown in FIG. 2A, first of all, a first metal plate 16, the semiconductor chip 20, and a second metal plate 56 are prepared. The semiconductor chip 20 is adjusted in advance to have a thickness of 10 to 50 µm to thereby exhibit a flexibility.

The first metal plate 16 as one member to be prepared is formed as follows. That is, on one surface of a copper layer 10 with a thickness of about 50 μm, which serves as the copper-made terminal formation bump 13, the wiring film 11 is formed, which is made of, for example, nickel or copper and has a thickness of, for example, about 5 to 12 μm by selective plating, for example. In addition, on a surface portion of the wiring film 11, the electrode connection bumps 12 are selectively formed, which are made from, for example, a nickel film and a gold (or copper) film, or a nickel film, a copper film, and a gold film by selective plating, for example. The selective plating is a method of forming a resist film having a negative pattern with respect to a target pattern and carrying out plating with the resist film used as a mask to obtain an objective film.

The semiconductor chip 20 as another member to be prepared is adjusted in advance to have a thickness of 10 to 50 μm to thereby exhibit a flexibility as described above.

A base of the second metal plate 56 as the other member to be prepared is obtained as follows. That is, a metal plate is formed with a three-layer structure where a wiring film formation copper layer 50 and a bump formation copper layer are laminated through a nickel film with a thickness of about 0.5 to 2 μm. The wiring film formation copper layer 50 has a thickness of about 3 to 18 μm and forms the wiring film 51. The bump formation copper layer has a thickness of about 30 to 100 μm and serves as the interlayer connection bump 52. Then, the bump formation copper layer is subjected to photo-etching to form the interlayer connection bump 52. The surface of the nickel film is exposed and further etched using as an etching mask the left interlayer connection bump 52.

The second metal plate 56 has no interlayer connection bumps 52 at a portion where the semiconductor chip 20 is to be mounted when the second metal plate 56 is laminated on the first metal plate 16 connected with the semiconductor chip 20 through flip-chip bonding. The second metal plate 56 has the semiconductor chip accommodating space 42 for accommodating the semiconductor chip 20 at the portion instead.

The interlayer connection bump 52 passes through the second metal plate 56, on which the interlayer insulating film 40 having a pattern not covering the semiconductor chip accommodating space 42 (pattern with a device hole) is laminated.

The interlayer insulating film 40 is made from an insulating film such as a polyimide film, a liquid crystal polymer film, a glass cloth impregnated with a B-stage resin, or a BCB film. The semiconductor chip accommodating space 42 for arranging the semiconductor chip 20 is defined in the interlayer insulating film 40, which can be called the device hole with a size of about 20 mm×20 mm, for example. Note that the thickness of the interlayer insulating film 40 is almost the same as that of the semiconductor chip 20 or is larger than that of the semiconductor chip 20 by about 1 to 5 μm.

Further, a gap filling resin 58 is applied on the semiconductor chip accommodating space 42, in other words, the portion where the semiconductor chip 20 is mounted. This is for causing no gap between the semiconductor chip 20 and the second metal plate 56 and to insulate the wiring film 51 formed by etching the reverse side of the semiconductor chip 20 and the copper layer 50.

Figure 2B:
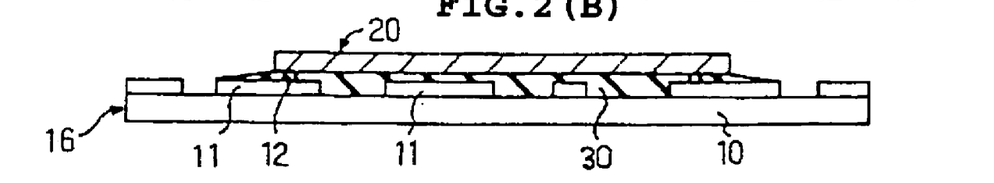

(B) Next, an insulating material (the insulating film 30) made of an underfill resin or film (ACF, ACP, NCF, or NCP) is applied onto the portion of the first metal plate 16 at which the semiconductor chip 20 is mounted. The semiconductor chip 20 is mounted onto and connected with the first metal plate 16 through flip-chip bonding such that each electrode of the chip is connected with the corresponding electrode connection bump 12 on the wiring film 11. In this case, the insulating film 30 is interposed between the semiconductor chip 20 and the first metal plate 16. FIG. 2B shows a state after the flip-chip bonding.

Figure 2C:
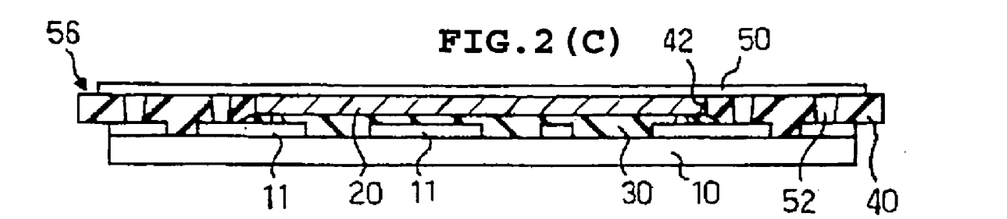

(C) Subsequently, as shown in FIG. 2C, the second metal plate 56 is laminated on the first metal plate 16 having the semiconductor chip 20 mounted thereon. More specifically, the lamination is carried out in such a way that makes the semiconductor chip 20 accommodated within the semiconductor chip accommodating space 42 and connects with the wiring film 11 the top surface of the interlayer connection bump 52 that passes through the interlayer insulating film 40.

In FIG. 2C, the gap filling resin 58, which causes no gap between the semiconductor 20 and the second metal plate 56 and to insulate electrically the wiring film 51 formed by etching the reverse side of the semiconductor 20 and the copper layer 50, is not described by omitting it.

Figure 2D:
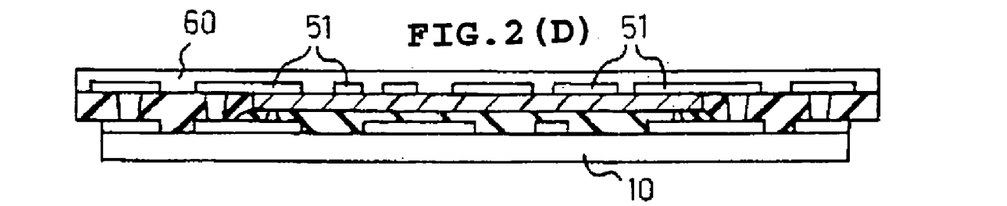

(D) Then, as shown in FIG. 2D, the wiring film 51 is formed by selectively etching the wiring film formation copper layer 50 of the second metal plate 56, followed by forming a covering layer 60.

Figure 2E:
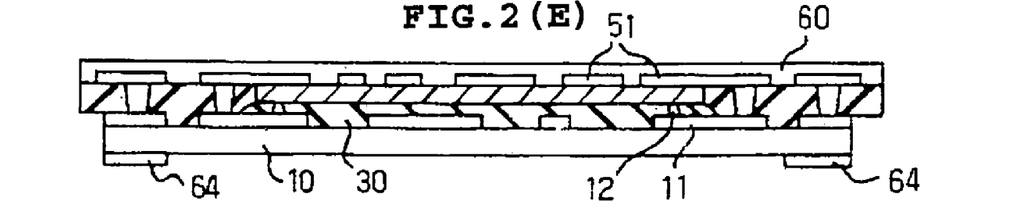

(E) Following this, as shown in FIG. 2E, resist films 64 used as an etching mask are selectively formed on the terminal bump formation copper layer 10 for forming a terminal bump by selectively etching the copper layer 10 of the first metal plate 16.

Figure 2F:
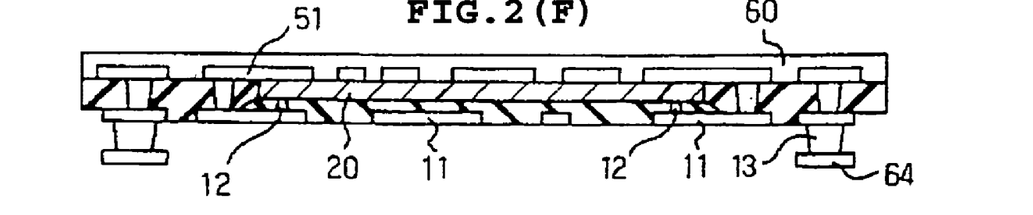

(F) Next, as shown in FIG. 2F, the terminal bump 13 is formed by etching the terminal bump formation copper layer 10 using each resist film 64 as a mask.

After that, although not shown in FIGS. 2A to 2F, the resist film 64 is peeled off and the nickel film is removed through etching by using the terminal bump 13 as a mask to form the solder ball 15 surrounding the terminal bump 13.

As mentioned above, in the multilayer wiring board according to this embodiment, the semiconductor chip 20 is embedded in between the two wiring films (11 and 51) and the insulating film 30 or the interlayer insulating film 40, for example, surrounds and protects the chip. Therefore, the semiconductor chip 20 can be designed to have a thickness small enough to exhibit the flexibility, which is 50 μm or smaller. The multilayer wiring board can attain a flexibility in its entirety.

Note that the present invention is not limited to the above embodiment but allows various modifications. Modified examples thereof include the following.

(1) The multilayer wiring board of the two-layer structure has been described, but the number of layers can be arbitrarily set.

(2) The semiconductor chips 20 may be provided for each layer in an arbitrary number. In addition to the semiconductor chip 20, any other passive functional elements such as a resistor and a capacitor may be incorporated therein.

(3) The thickness of the copper layer etc. constituting the wiring films 11 and 51, the thickness and material of the insulating film 30 and the interlayer insulating film 40, and the like are not limited to the illustrated ones.

(4) The wiring film 51 is formed using the metal plate of three-layer structure including an etching stopper made from a nickel film. The formation method and material therefor are not limited to the illustrated ones.

(5) In the above embodiment as shown in FIGS. 1A to 2F, the wiring film 11 is formed by selectively plating the surface of the copper layer 10 with nickel or copper. Further, the plural bumps 12 for mounting the semiconductor chip are formed at predetermined portions of the wiring film 11. However, the formation method for the wiring film 11 is not limited to this method. For example, it is possible that a copper layer serving as the wiring film 11 is used, the plural bumps 12 for mounting the semiconductor chip are formed at predetermined portions on the copper layer, and the copper layer is etched to thereby form the wiring film 11.

(6) In the above embodiment, the plural bumps 12 for mounting the semiconductor chip 20 are formed at predetermined portions of the wiring film 11. However, it is possible to dispense with the bumps 12 in the case where connection bumps are formed on the semiconductor chip 20 side.

(7) In the above embodiment, the thickness of the interlayer insulating film 40 is almost the same as that of the semiconductor chip 20 or is larger than that of the semiconductor chip 20 by about 1 to 5 μm. However, the insulating film thickness may set to ⅓ or ⅔ of the second copper layer of the second metal plate 56, which forms the interlayer connection bump 52.

Second Embodiment

Figure 3:
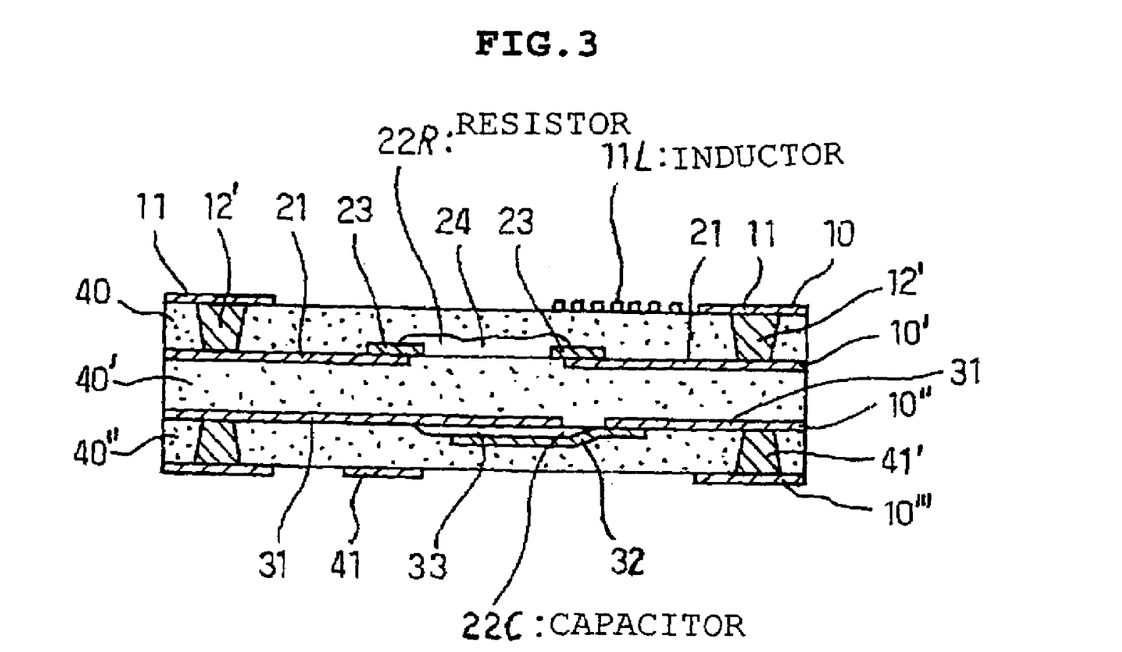
FIG. 3 is a sectional view showing a multilayer wiring board for an electronic device according to a second embodiment of the present invention.

Hereinafter, the present invention will be described in detail according to a second embodiment of the present invention with reference to the corresponding drawings. FIG. 3 is a sectional view showing a multilayer wiring board according to the second embodiment of the present invention.

The multilayer wring board has a four-layer structure where the wiring film 11 and a wiring film 41 constitute both surfaces of the board, which sandwich wiring films 21 and 31 each having a passive element formed at the center, the four films being laminated. Interlayer insulating films 40, 40', and 40" are interposed between the wiring films 11 and 21, between the wiring films 21 and 31, and between the wiring films 31 and 41, respectively.

The wiring film 11 is formed as follows. That is, an interlayer connection bump 12' is formed by selectively etching the second copper layer of the metal plate of the three-layer structure where the first copper layer 10 with a thickness of about 3 to 18 μm and the second copper layer with a thickness of about 50 to 100 μm are laminated through an intermediate layer as a nickel layer with a thickness of about 0.5 to 2 μm. After that, the first copper layer 10 is selectively etched as described later.

The wiring film 11 includes an inductor 11L formed according to a coil-shaped pattern, in addition to general wirings. The wiring film 41 is formed by selectively etching a copper layer 10''' as mentioned below. The wiring film 41 is substantially the same as the wiring film 11 except for the pattern shape and the bump arrangement for bumps 41'.

The wiring film 21 is formed by selectively etching a copper layer 10' as described below. (Plural) silver paste electrodes 23, 23 are formed apart from each other on the wiring film 21. Further, a resistance film (element film) 24 made of a low-temperature curing organic resin such as carbon phenol is formed on the silver paste electrodes 23, 23 to connect therebetween, for example. The resistance film 24 and the silver paste electrodes 23, 23 constitute a resistor element 22R as a passive element.

The wiring film 31 is formed by selectively etching a copper layer 10" as described below. The wiring film 31 is connected with a capacitor 22C as a passive element serving as a circuit element. Reference numeral 33 denotes a dielectric layer (element film) made of a low-temperature curing organic resin mainly containing barium titanate, for example. The layer constitutes a dielectric of the capacitor 22C and overlaps with part of the wiring film 31.

The wiring film 31 constitutes one electrode of the capacitor 22C at a portion overlapping with the dielectric layer 33.

Note that it is also possible to form the resistance film (resistor element) 22R using the low-temperature curing organic resin such as carbon phenol or the dielectric layer 33 using a printed film made of the low-temperature curing organic resin mainly containing barium titanate by selectively applying a paste-like material through printing etc. and then drying the applied paste, followed by thermally curing the resultant at around 200° C. Otherwise, the formation thereof can be performed by thermally curing the whole, followed by selective etching.

Denoted by 32 is a silver paste film having a portion facing the one electrode through the dielectric layer 33 (printed film) and a portion connected with the wiring film 31. The portion facing the one electrode constitutes the other electrode of the capacitor 22C.

The interlayer insulating films 40, 40', and 40" are made of polyimide film, a liquid crystal polymer film, or a prepreg (glass cloth impregnated with a B-stage resin) used for various printed wiring boards, with a thickness corresponding to ⅓ or ⅔ of the second copper layer.

The wiring film 21 is connected with the wiring film 11 at a predetermined portion through the interlayer connection bump 12' formed on the wiring film 11 so as to pass through the interlayer insulating film 40. Also, the wiring film 31 is connected with the wiring film 41 at a predetermined portion through the bump 41' formed on the wiring film 41 so as to pass through the interlayer insulating film 40".

Note that although not shown, the wiring films 11 and 41 are provided with external connection electrodes at predetermined portions as well as bumps for connecting between the wiring films 11 and 41 at predetermined portions.

Figure 4A:
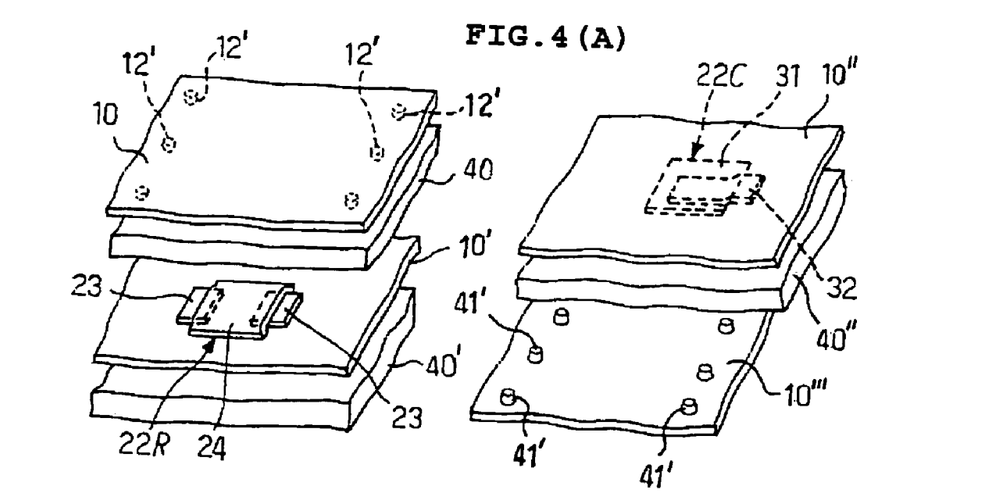
FIGS. 4A to 4C each show a method of manufacturing a multilayer wiring board for an electronic device according to an embodiment of the present invention in the step order.
Figure 4B:
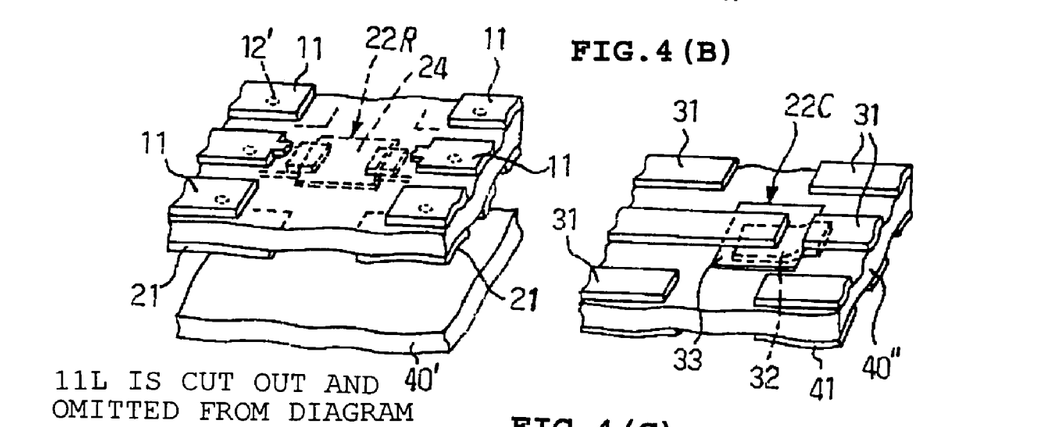
Figure 4C:
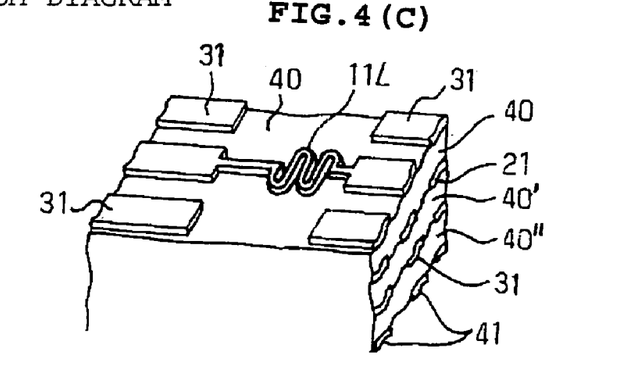

FIGS. 4A to 4C are sectional views each showing an embodiment of a method of manufacturing a multilayer wiring board according to the present invention in the step order. Hereinafter, referring to FIGS. 4A to 4C, a method of manufacturing the multilayer wiring board for an electronic device will be described.

(A) As shown in FIG. 4A, formed is the copper layer 10 serving as the wiring film 11 or the inductor 11L made from the wiring film 11 later with the bump 12' formed on a rear surface thereof. The interlayer insulating film 40 is prepared. The copper layer 10' that serves as the wiring film 21 later is formed where the passive element, for example, the resistor 22R and the silver paste electrodes 23, 23 as electrodes for the resistor formed are formed on its front surface. The interlayer insulating film 40' is prepared. The copper layer 10" that serves as the wiring film 31 later is formed where the passive element, for example, the capacitor 22C are formed on its rear surface. The copper layer 10''' that serves as the wiring film 41 later is prepared where the bump 41' is formed on its front surface.

The copper layer 10 first constitutes the first copper layer of the metal plate of three-layer structure obtained by laminating the first copper layer with a thickness of about 3 to 18 um and the second copper layer with a thickness of about 50 to 100 um through the nickel layer constituting the etching barrier with a thickness of about 0.5 to 2 um.

The second copper layer of the metal plate is subjected to photo-etching to form the interlayer connection bump 12' and the nickel layer is etched using the bump 12' as a mask to thereby complete the copper layer 10 with the bump 12' as shown in FIG. 4A.

The copper layer 10' is formed by printing the (plural) silver paste electrodes 23, 23 on its surface, followed by drying, for example. Further, the resistance film (resistor element) 22R made of a low-temperature curing organic resin such as carbon phenol is printed over the silver paste electrodes 23, 23 so as to connect therebetween, followed by drying.

The copper layer 10" is formed such that a passive element as a circuit element, for example, the dielectric layer 33 (printed film) of the capacitor 22C is printed on its rear surface and in addition, the silver paste film 32 constituting the other electrode of the capacitor 22C is printed. The dielectric layer 33 and the silver paste film 32 are dried after being printed.

The copper layer 10''' is formed similarly to the copper layer 10.

The interlayer insulating films 40, 40', and 40" are formed of, for example, polyimide film, a liquid crystal polymer film, or a prepreg used for various printed wiring boards.

(B) Next, as shown in FIG. 4B, the copper layers 10 and 10' are integrally laminated through the interlayer insulating film 40. In addition, the copper layers 10" and 10''' are integrally laminated through the interlayer insulating film 40". Following this, the copper layers 10 and 10' constituting both surface layers of the thus integrated structure are selectively etched. The same applies to the copper layers 10" and 10'''.

To detail this, the copper layers 10 and 10' are integrated through the interlayer insulating film 40 as follows.

First, the interlayer insulating film 40 overlaps with the surface having the bump 12' formed thereon of the copper layer 10 and is then pressurized against the bump 12' for lamination in such a way that allows the bump 12' to penetrate the interlayer insulating film 40 with any protective film or cushioning material being interposed therebetween. Then, the cushioning material is peeled off and the exposed surface is polished so as to be flush with the surfaces of the other portions. After that, the protective film is peeled off (in this state, the bump 12' protrudes from the interlayer insulating film 40), and after a while, the copper layer 10' is laminated on the polished surface under pressure and heat.

At this point, the interlayer insulating film 40 exhibits viscosity due to heating, and hence the layers can be insulated from each other without damaging the resistor 22R or other such passive elements.

Also, the copper layers 10" and 10''' can be integrated through the interlayer insulating film 40" as follows. That is, the interlayer insulating film 40" overlaps with the surface having the bump formed thereon of the copper layer 10''' and is then pressurized against the bump 41' for lamination in such a way that allows the bump 41' to penetrate the interlayer insulating film 40" with any protective film or cushioning material being interposed therebetween. Then, the cushioning material is peeled off and the exposed surface is polished so as to be flush with the surfaces of the other portions. After that, the protective film is peeled off (in this state, the bump 41' protrudes from the interlayer insulating film 40"), and after a while, the copper layer 10" is laminated on the polished surface under pressure and heat. At this point, the interlayer insulating film 40" exhibits viscosity due to heating, and hence the layers can be insulated from each other without damaging the capacitor 22C or other such passive elements.

Then, the wiring films 11 and 21 are formed by selectively etching the copper layers 10 and 10' constituting both surface layers of the integrated structure where the copper layers 10 and 10' are laminated through the interlayer insulating film 40.

Also, the wiring films 31 and 41 are formed by selectively etching the copper layers 10" and 10''' constituting both surface layers of the integrated structure where the copper layers 10" and 10''' are laminated through the interlayer insulating film 40". The same applies to the copper layers 10" and 10'''.

Note that at a stage of FIG. 4B, the interlayer insulating film 40' is not used. In FIG. 4B, the inductor 11L formed from the wring film 11 is omitted for showing the resistor 22R formed below the inductor; the resistor is indicated by the dashed line. The inductor 11L is not omitted but shown in FIG. 4C.

(C) Next, as shown in FIG. 4C, the laminate composed of the wiring film 11, the interlayer insulating film 40, and the wiring film 21, and the laminate composed of the wiring film 31, the interlayer insulating film 40", and the wiring film (copper layer) 41 are integrally laminated through the interlayer insulating film 40' under pressure and heat. The multilayer wiring board as shown in FIG. 3 is thus completed.

In this way, the multilayer wiring board according to this embodiment has the passive element as the circuit element embedded therein. Thus, there is an advantage that the semiconductor integrated circuit elements or the passive elements can be stereoscopically (three-dimensionally) arranged, which offers a multilayer wiring board with high packaging density.

FIGS. 5A to 5D show different examples of a passive element incorporated into the multilayer wiring board.

Figure 5A:
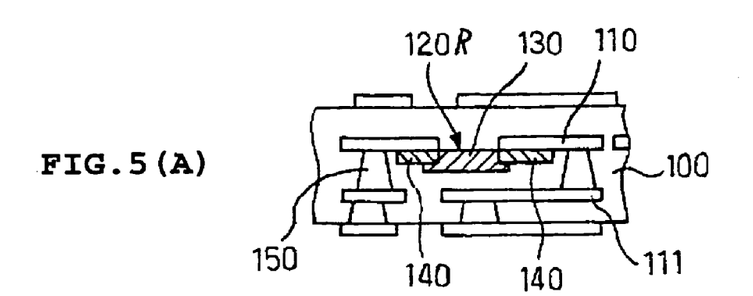
FIGS. 5A to 5D show different examples of a passive element incorporated into the multilayer wiring board according to the second embodiment of the present invention.

The passive element as the circuit element of FIG. 5A is a resistor (resistor element). In FIGS. 5A to 5D, reference numeral 100 denotes an interlayer insulating film; 110 and 111, wiring films made of copper; and 120R, a resistor element. Electrodes 140 are each formed from, for example, a printed silver paste film and connected with the wiring film 110. Formed between the electrodes 140, 140 is a resistance film 130 as a printed layer made of a low-temperature curing organic resin such as carbon phenol. The resistance film 130 constitutes the resistor element 120R. Reference numeral 150 denotes a bump.

Note that the resistance film 130 may be patterned such that a wire width is narrowed and a wire extends in zigzags to lengthen the wire using the same material, for example, or such that its occupying area is reduced to have a high resistance value. The bump 150 is an interlayer connection bump.

The resistor 120R can be prepared by printing a silver paste film, for example, on one surface of the copper layer forming the wiring film 110 to thereby form the electrodes 140, 140, and then printing a low-temperature curing organic resin such as carbon phenol, and drying and curing the resultant to thereby form the resistance film 130.

The bump 150 is formed on one surface of the other copper layer. The interlayer insulating film 100 is laminated on the one surface such that the bump 150 penetrates the interlayer insulating film. The copper layer having the resistor 120R formed thereon is laminated on the other copper layer in such a way that connects the top surface of the bump 150 with the copper layer having the resistor 120R formed thereon. Thereafter, the copper layers at both sides of the laminate are selectively etched to thereby form the wiring films 110 and 111.

Note that, both terminals of the resistance film 130 may be directly connected with the wiring film 110 instead of forming the electrodes using the conductive paste films.

Figure 5B:
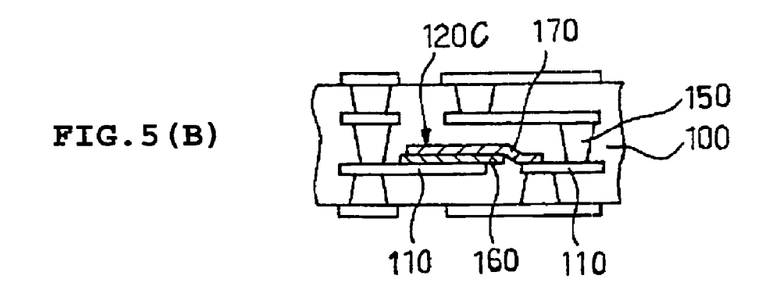

A passive element as a circuit element of FIG. 5B is a capacitor (capacitor element) 120C. Reference numeral 160 denotes a dielectric layer constituting a dielectric of the capacitor 120C, which is made of, for example, barium titanate. The dielectric layer 160 is formed while overlapping with some region of the wiring film 110. A silver paste film 170 is formed on the dielectric layer 160 and over the wiring film 110 having the dielectric layer 160 formed thereon and the other wiring film 110. A portion of the silver paste film 170 facing the wiring film 110 through the dielectric layer 160 constitutes an electrode of the capacitor (capacitor element) 120C.

Figure 5C:
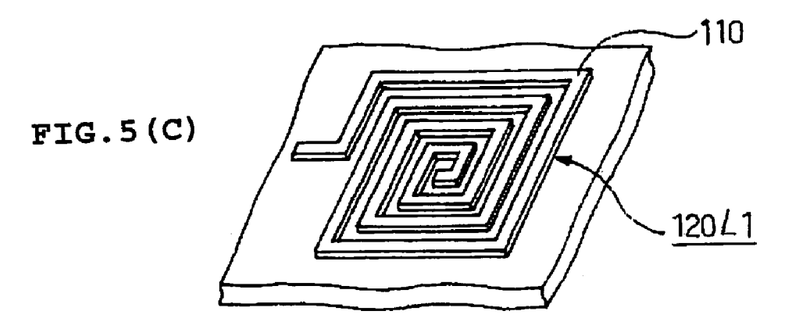
Figure 5D:
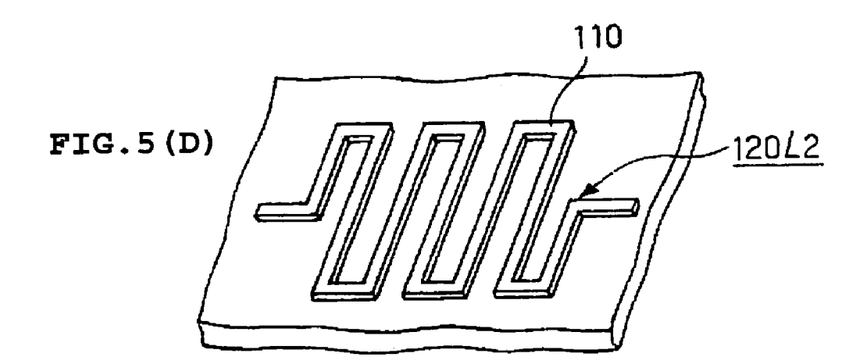

Passive elements of FIGS. 5C and 5D are inductors (inductor elements) 120L1 and 120L2, respectively, which are formed according to different patterns. The inductors 120L1 and 120L2 are formed by using the wiring film 110 as is, i.e., by merely patterning the wiring film 110 into a spiral shape and a meander shape, respectively. Note that as for the inductor 120L1 formed by patterning the wiring film 110 into a spiral shape, the interlayer connection bump or other such interlayer connection means may be used for taking out its internal electrode.

The above embodiments are each presented only as one embodiment of the present invention and the present invention may allow various modifications.

The modification is represented by the following, for example.

(1) As the embodiment of the present invention, the multilayer wiring board of the four-layer structure is employed, but an arbitrary number of layers may be used. Accordingly, the inductor 11L of FIG. 3 is formed on the wiring board surface in the structural example of FIG. 3. However, needless to say, the inductor may be embedded in the inner layer of the wiring board as needed.

(2) It is possible to arbitrarily set the type and number of passive elements as the circuit elements (i.e., the inductors 11L, 120L1, and 120L2, the resistor 22R, and the capacitors 22C and 120C) provided for each layer.

(3) The description has been made of the formation of the resistors 22R and 120R, or the capacitors 22C and 120C with the low-temperature curing organic resin. However, it is possible to adopt a method of printing a high-temperature calcining inorganic resin thick paste film and drying the film, and then sintering the resultant film in a reducing atmosphere furnace to form the above elements. In this case, an inorganic paste (ruthenium oxide, lanthanum boride, tin oxide, or the like) is used for the resistor 120R, while an inorganic paste mainly containing barium titanate is used for the capacitor 120C. Also, the passive element or electrode of the passive element may be formed through not printing but overall sintering treatment and selectively etching the film thus formed.

(4) The thickness of the copper layer etc. constituting the wiring films 11 and 41, the thickness and material of the insulating films 40 to 40''', and the like are not limited to the illustrated ones.

(5) The resistor 120R is prepared such that the silver paste electrodes 140, 140 are formed on the surface of the copper layer (wiring film 110) and in addition, the resistance film 130 is formed to connect therebetween. Part of the wiring film 110 may constitute the electrodes, and the resistance film 130 may connect therebetween instead.

(6) The wiring films 11 and 41 are formed using the metal plate of three-layer structure having the etching stopper made from nickel layer, but the formation method and material therefor are not limited to the illustrated ones.

Third Embodiment

Figure 6:
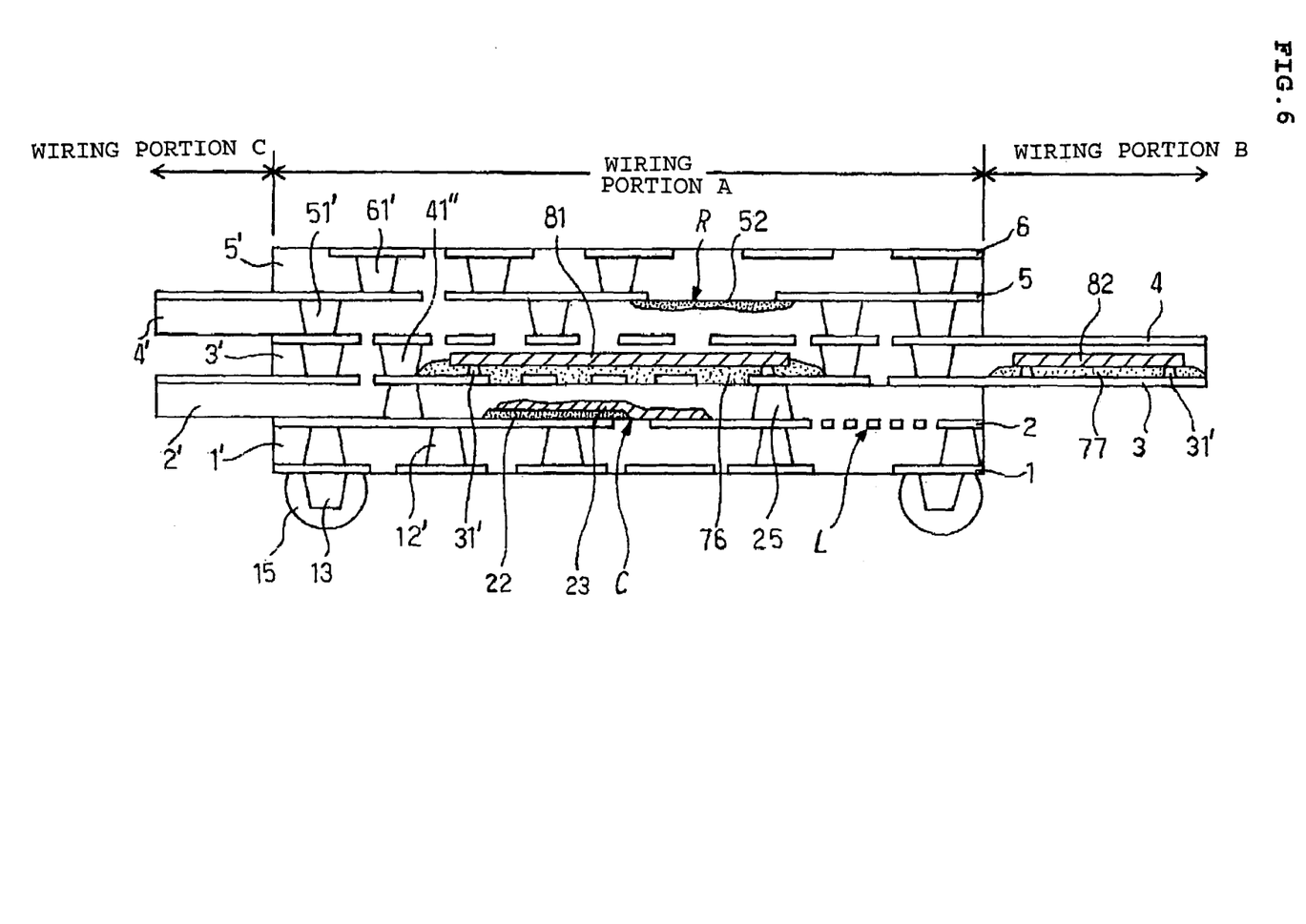
FIG. 6 is a sectional view showing a multilayer wiring board with a built-in circuit element according to a third embodiment of the present invention.

Hereinafter, the present invention will be described in detail according to a third embodiment of the present invention with reference to the corresponding drawings. FIG. 6 is a sectional view showing a multilayer wiring board for an electronic device with a built-in circuit element according to the third embodiment of the present invention.

The multilayer wiring board with a built-in circuit element is prepared by laminating wiring films 1, 2, 3, 4, 5, and 6 through interlayer insulating films 1', 2', 3', 4', and 5' made of polyimide film, a liquid crystal polymer film, or a BCB film. The board has a rigid wiring portion A composed of all the wiring films 1 to 6, a flexible wiring portion B composed of part of the wiring films 3 and 4, which extend from the wiring portion A, and a flexible wiring portion C composed of part of the wiring films 3 and 5, which extend from the wiring portion A.

The wiring film 1 is made from a copper layer formed into a predetermined pattern. The plural bumps 12' are formed on one surface of the wiring film 1 for connection with the wiring film 2. The plural external connection terminals 13 are formed on the other surface (surface opposite to the surface where the bumps 12' are formed) of the wiring film 1.

The bumps 12' are each formed integrally with the wiring film 1 by etching a laminate metal plate obtained by laminating copper with a thickness of about 3 to 18 µm, which forms a wiring pattern after etching, and copper with a thickness of 30 to 100 µm, which forms the bump 12' after etching, through nickel with a thickness of 0.5 to 2.0 µm, which forms an etching barrier.

The wiring films 1 and 2 are connected to each other through the bump 12' passing through the insulating film 1'. Also, the external connection terminals bump 13 are each constituted of a terminal bump 13 connected with the wiring film 1 and a solder ball 15 covering the external connection terminal bump 13.

The wiring film 2 is made from a copper layer formed into a predetermined pattern and plural bumps 25 are formed on the wiring film 2. The wiring film is partially patterned into a meander shape to constitute an inductor L. The bumps 25 are each formed for connecting between the wiring films 2 and 3. Denoted by C is a capacitor composed of a dielectric film 22 applied to a portion serving as an electrode and a silver paste electrode 23 formed on the dielectric film 22 through the application.

The wiring film 3 is made from a copper layer formed into a predetermined pattern. Formed on one surface of the wiring film 3 are plural bumps 31' made of gold, for example, for flip-chip bonding to LSI chips 81 and 82. The wiring film 3 and the wiring film 4 formed above the wiring film 3 are insulated from each other with the insulating film (resin) 3' or with the gap filling resin 58 (FIG. 2(A)). The LSI chips 81 and 82 are incorporated into the insulating film (resin) 3'.

Reference numerals 76 and 77 denote resins as underfill resins filled in portions between the LSI chip 81 as the circuit element and the insulating film (resin) 2' and between the LSI chip 82 as the circuit element and the wiring film 3.

The LSI chips 81 and 82 are each prepared by polishing a wafer member at a rear surface so as to have a thickness of 50 µm or smaller. The LSI chips 81 and 82 are mounted to the rigid wiring portion A and the flexible wiring portion B, respectively.

The LSI chips 81 and 82 are prepared as follows. That is, the thickness thereof is adjusted to 10 to 50 µm by polishing the surface opposite to the main surface where the integrated circuit is formed, that is, the rear surface of the semiconductor substrate (semiconductor substrate after cut into a semiconductor chip or still in a wafer state). Further, the prepared one is cut into a chip with a size of about 20 mm on a side, for example. The inventors of the present invention have made studies and experiments and thus confirmed that this type of chip having a rectangular shape with a size of about 20 mm on a side, for example, and a thickness of 50 µm or smaller can exhibit a flexibility.

Thus, the chip can be, because of its flexibility, incorporated into the flexible wiring portion B without impairing the flexibility. This means that conventional elements such as LSI chips can be incorporated into the flexible wiring portion B, leading to further improvements in packaging density of the wiring board.

The wiring film 4 is made from a copper layer formed into a predetermined pattern. Plural bumps 41" are formed on one (lower) surface of the wiring film 4 for connecting between the wiring films 3 and 4. The wiring films 3 and 4 are connected to each other with the bump 41" passing through the insulating film 3' formed outside the portions where the LSI chips 81 and 82 are mounted, through the insulating film 3' with the LSI chips 81 and 82 interposed therebetween.

The wiring film 5 is made from a copper layer formed into a predetermined pattern. The resistor R as the circuit element (functional element) and plural bumps 51' for connection with the wiring film 4 are formed on one (lower) surface thereof.

The resistor R is constituted of a film resistor element 52 formed between portions serving as electrodes through the application. The bump 51' passing through the wiring film 4' connects between the wiring films 4 and 5 through the insulating film 4'.

The wiring film 6 is made from a copper layer formed into a predetermined pattern. Plural bumps 61' are formed on one (lower) surface of the wiring film 6 for connection with the wiring film 5. The wiring films 5 and 6 are insulated from each other with the insulating film 5' and connected through the bump 61' passing through the insulating film 5'.

The above wiring board with a built-in circuit element is manufactured substantially through the following steps.

(1) The plural bumps 31' made of gold, for example, are formed for connection with the LSI chips 81 and 82 on the copper layer serving as the wiring film 3 by selective plating. The LSI chips 81 and 82, after the wafer member at the rear surface is polished to a thickness of 50 µm or smaller, are subjected to flip-chip bonding thereto through the insulating resins 76 and 77, respectively.

(2) The laminate metal plate is prepared by laminating the first copper layer with a thickness of about 3 to 18 µm, which forms a wiring pattern for the wiring film 4 after etching, and the second copper layer with a thickness of 30 to 100 µm, which forms the bump 41" after etching, through a nickel layer with a thickness of 0.5 to 2 µm, which forms an etching barrier. Then, the second copper layer is etched into the bump 41". Further, the bump 41" formed from the second copper layer is used as an etching mask for etching the nickel layer to form a bump 41'".

(3) The insulating film made of polyimide, a liquid crystal polymer, or a BCB film is holed at portions where the LSI chips 81 and 82 are mounted as a device hole to thereby form the insulating film 3'. The wiring film 4 having the bump 41" formed thereon is brought into pressure contact with the insulating film 3' so as to allow the bump 41" to penetrate the wiring film 3'. Further, the tip portion of the bump 41" protruding through the wiring film 3' is polished until it becomes substantially flush with the insulating film 3' surface.

(4) An opening (device hole) of the insulating film 3' integrated with the wiring film 4 is applied with a gap filling resin (not shown) to press-bond thereto the wiring film 3 where the LSI chips 81 and 82 are mounted. As a result, the laminate plate is obtained, in which the wiring films 3 and 4 are laminated through the insulating film 3' and the LSI chips 81 and 82 are incorporated therein.

(5) The copper layers for the wiring films 3 and 4 of the laminate plate prepared in the step of (4) are etched and patterned with a predetermined pattern.

(6) The laminate metal plate is prepared similarly to the step of (2). The plural bumps 25 are formed on the copper layer forming the wiring film 2 through the similar step. The dielectric film 22 of the capacitor C is formed through the application on the surface having the bump 25 formed thereon of the wiring film 2. Then, after dried and cured, the dielectric film 22 is applied with the silver paste film 23, followed by drying and curing.

(7) The wiring film 2 having the bump 25 formed thereon is brought into pressure contact with the insulating film 2' such that the bump 25 passes through the insulating film 2'. The tip portion of the bump 25, which protrudes through the insulating film 2' is polished so as to be flush with the insulating film 2' surface.

(8) The resistor R and the bump 51' are formed on the copper layer forming the wiring pattern through steps similar to those of (6) and (7). Further, the insulating film 4' is integrally laminated on the surface thereof to form the wiring film 5.

(9) The wiring patterns of the wiring films 3 and 4, which are formed in the step of (5) overlap and connect with the wiring film 2 formed in the step of (7) and the wiring film 5 formed in the step of (8) through the bumps 25 and 51', respectively.

(10) The copper layers of the wiring films 2 and 5 at the surfaces of the wiring board, which are laminated in the step of (9), are etched respectively into predetermined patterns.

(11) The laminate metal plate is prepared similarly to the step of (2) and the plural bumps 61' are formed on the copper layer forming the wiring film 6 through the similar step. Further, the insulating film 5' is integrally laminated on the surface of the copper layer forming the wiring pattern through the step similar to that of (7) to thereby form the wiring film 6.

(12) The wiring film 1 is formed by integrally laminating the insulating film 1' on the surface of the copper layer forming the wiring pattern through the same step as that of (11).

(13) The wiring patterns of the wiring films 2 and 5 formed in the step of (10) overlap and connect with the wiring film 1 formed in the step of (12) and the wiring film 6 formed in the step of (11), respectively, through the bumps 12' and 61', respectively.

(14) The copper layers of the wiring films 1 and 6 at the surfaces of the wiring board, which are laminated in the step of (13), are etched respectively into predetermined patterns.

(15) The external connection terminal 13 is formed at a predetermined position of the wiring pattern of the wiring film 1 formed in the step of (14). Through the above steps, the multilayer wiring board for an electronic device with a built-in circuit element as shown in FIG. 6 is thus completed.

As set forth hereinabove, the wiring board with a built-in functional element according to this embodiment is such that the semiconductor integrated circuit elements or passive functional elements are embedded inside the multilayer wiring board, whereby the functional elements can be three-dimensionally arranged. Thus, the multilayer wiring board having high packaging density can be obtained. Also, the flexible wiring portion as well as the rigid wiring portion are provided, whereby there is an advantage that the multilayer wiring board can find its application in a wider range.

Further, regarding the wiring films, the laminate metal plate of the three-layer structure is etched and the bumps and the wiring patterns are integrally formed, which brings about an advantage that the highly reliable multilayer wiring board can be offered.

Note that the present invention is not limited to the above embodiments but allows various modifications. Modified examples thereof include the following.

(A) In the above description, the rigid wiring portion A has the six-layer structure while the flexible wiring portions B and C have the two-layer structure and the single-layer structure, respectively. However, an arbitrary number of layers may be used for each wiring portion.

(B) The types and numbers of circuit elements (inductor L) and passive functional elements (resistors L and R and capacitor C) can be arbitrarily set for each layer.

(C) The plural bumps 31' made of gold, for example, for flip-chip bonding to the LSI chips 81 and 82 are formed at predetermined portions of the wiring film 3. However, it is possible to dispense with the gold-made bumps 31' in the case where the connection bumps are formed on the LSI chip side.

(D) The wiring films 1, 2, 4, 5, and 6 are formed using the laminate metal plate of the three-layer structure having the etching stopper made from the nickel layer. However, the formation method and material therefor are not limited to the illustrated ones.

(E) The resistor R is prepared such that part of the copper layer constitutes the electrodes and the film resistor element 52 connects therebetween. However, it is possible that the silver paste electrodes are formed on the copper layer surface and the resistor element is formed through the application so as to connect between the silver paste electrodes, followed by drying and curing.

What is claimed is:

1. A multiple level circuit assembly, including:
   a first insulating film having a first major surface and a first patterned metal wiring film extending along said first major surface;
   a second insulating film having a second major surface and a second patterned metal wiring film extending along said second major surface, said second insulating film overlying said first insulating film and at least said second patterned metal wiring film contacting said first insulating film;
   a first plurality of etched metal bump interconnects having a first height, conductively connecting said first patterned metal wiring film to said second patterned metal wiring film, said first etched metal bump interconnects extending through at least one of said first and second insulating films in a direction transverse to said first and second major surfaces;
   a semiconductor chip having a thickness of about 50 micrometers (μm) or smaller, said semiconductor chip disposed between said first and second patterned wiring films, said semiconductor chip having bond pads conductively connected to said first patterned metal wiring films;
   a second plurality of etched metal bump interconnects having a second height, conductively connecting said semiconductor chip and said second patterned wiring film, wherein said first height is greater than said second height; and
   a plurality of external contacts exposed at one or more external surfaces of said circuit panel assembly, said contacts conductively connected to at least one of said first and second patterned metal wiring films.

2. The multiple level circuit assembly as claimed in claim 1, wherein said bond pads of said semiconductor chip are provided on a front surface of said semiconductor chip and said bond pads are surface-mounted to contacts exposed at a front surface said at least one of said first and second patterned metal wiring films.

3. The multiple level circuit assembly as claimed in claim 1, wherein said external contacts project outward from a rear surface of said at least one of said first and second patterned metal wiring films.

4. The multiple level circuit assembly as claimed in claim 3, wherein said external contacts consist essentially of copper.

5. The multiple level circuit assembly as claimed in claim 3, wherein said external contacts consist essentially of copper and said first and second patterned metal wiring films consist essentially of copper.

6. The multiple level circuit assembly as claimed in claim 1, wherein at least one of said first and second insulating films includes at least one material selected from the group consisting of polyimide, liquid crystal polymer, glass cloth combined with a B-stage resin and a BCB film.

7. The multiple level circuit assembly as claimed in claim 1, further comprising a plurality of conductive contacts projecting from a major surface of said at least one of said first and second patterned metal wiring films, wherein said bond pads of said semiconductor chip are conductively connected to said contacts.

8. The multiple level circuit assembly as claimed in claim 1, wherein said second major surface of said second insulating film contacts said first insulating film.

9. The multiple level circuit assembly as claimed in claim 1, wherein said first insulating film includes a plurality of recesses, and said first patterned metal wiring film is embedded in said plurality of recesses in said first insulating film.

10. The multiple level circuit assembly as claimed in claim 1, wherein said second insulating film includes a plurality of recesses, and said second patterned metal wiring film is embedded in said plurality of recesses in said second insulating film.

11. The multiple level circuit assembly as claimed in claim 1, wherein said first height is greater than said thickness of said semiconductor chip.

12. The multiple level circuit assembly as claimed in claim 1, wherein said first height is greater than or equal to a sum of said second height and said semiconductor chip thickness.

13. The multiple level circuit assembly as claimed in claim 1, said first insulating film is adjacent said semiconductor chip.

14. The multiple level circuit assembly as claimed in claim 13 wherein an adhesive is disposed between said semiconductor chip and said first insulating film.

15. The multiple level circuit assembly as claimed in claim 1, wherein said second metal bump interconnects comprise copper.

16. A multiple level circuit assembly, including:
- a first insulating film having a first major surface and a first patterned metal wiring film extending along said first major surface;
- a second insulating film having a second major surface and a second patterned metal wiring film extending along said second major surface, said second insulating film overlying said first insulating film and at least said second patterned metal wiring film contacting said first insulating film;
- a plurality of etched metal interconnects conductively connecting said first patterned metal wiring film to said second patterned metal wiring film, said etched metal interconnects extending through at least one of said first and second insulating films in a direction transverse to said first and second major surfaces;
- at least one capacitor having at least one electrode integral with at least one of said first or second patterned metal wiring films and a capacitor dielectric layer contacting said at least one electrode; and
- a plurality of external contacts exposed at one or more external surfaces of said circuit panel assembly, said contacts conductively connected to at least one of said first and second patterned metal wiring films.

17. The multiple level circuit assembly as claimed in claim 16, wherein said external contacts project outward from a rear surface of said at least one of said first and second patterned metal wiring films.

18. The multiple level circuit assembly as claimed in claim 17, wherein said external contacts consist essentially of copper.

19. The multiple level circuit assembly as claimed in claim 16, wherein said external contacts consist essentially of copper and said first and second patterned metal wiring films consist essentially of copper.

20. The multiple level circuit assembly as claimed in claim 16, wherein at least one of said first and second insulating films includes at least one material selected from the group consisting of polyimide, liquid crystal polymer, glass cloth combined with a B-stage resin and a BCB film.

21. The multiple level circuit assembly as claimed in claim 16, further comprising a third insulating film having a third major surface and a third patterned metal wiring film extending along said third major surface, wherein said plurality of metal interconnects interconnect said third patterned metal wiring film to at least one of said first or second patterned metal wiring films.

22. The multiple level circuit assembly as claimed in claim 16, further comprising a plurality of conductive contacts projecting from a major surface of said at least one of said first and second patterned metal wiring films.

23. The multiple level circuit assembly as claimed in claim 16, wherein said second major surface of said second insulating film contacts said first insulating film.

24. The multiple level circuit assembly as claimed in claim 16, wherein said first insulating film includes a plurality of recesses, and said first patterned metal wiring film is embedded in said plurality of recesses in said first insulating film.

25. The multiple level circuit assembly as claimed in claim 16, wherein said second insulating film includes a plurality of recesses, and said second patterned metal wiring film is embedded in said plurality of recesses in said second insulating film.

26. The multiple level circuit assembly as claimed in claim 16, wherein a second electrode is integral with at least one of said first or second patterned metal wiring films and a capacitor dielectric layer.

\* \* \* \* \*

UNITED STATES PATENT AND TRADEMARK OFFICE
CERTIFICATE OF CORRECTION

PATENT NO. : 7,342,802 B2  Page 1 of 1
APPLICATION NO. : 10/880588
DATED : March 11, 2008
INVENTOR(S) : Iijima et al.

It is certified that error appears in the above-identified patent and that said Letters Patent is hereby corrected as shown below:

Column 18, line 17 after "surface" insert --of--.
Column 18, line 63 after "claim 1," insert --wherein--.

Signed and Sealed this

Thirty-first Day of March, 2009

JOHN DOLL
*Acting Director of the United States Patent and Trademark Office*